United States Patent
Gui et al.

(10) Patent No.: US 8,530,961 B2
(45) Date of Patent: Sep. 10, 2013

(54) COMPATIBLE VERTICAL DOUBLE DIFFUSED METAL OXIDE SEMICONDUCTOR TRANSISTOR AND LATERAL DOUBLE DIFFUSED METAL OXIDE SEMICONDUCTOR TRANSISTOR AND MANUFACTURE METHOD THEREOF

(75) Inventors: Linchun Gui, Wuxi (CN); Le Wang, Wuxi (CN); Zhiyong Zhao, Wuxi (CN); Lili He, Wuxi (CN)

(73) Assignee: CSMC Technologies FAB1 Co., Ltd. (CN)

( * ) Notice: Subject to any disclaimer, the term of this patent is extended or adjusted under 35 U.S.C. 154(b) by 0 days.

(21) Appl. No.: 13/384,002

(22) PCT Filed: Oct. 26, 2010

(86) PCT No.: PCT/CN2010/078121
§ 371 (c)(1),
(2), (4) Date: Jan. 13, 2012

(87) PCT Pub. No.: WO2011/050712
PCT Pub. Date: May 5, 2011

(65) Prior Publication Data
US 2012/0256252 A1    Oct. 11, 2012

(30) Foreign Application Priority Data

Oct. 28, 2009 (CN) .......................... 2009 1 0209187

(51) Int. Cl.
*H01L 29/66* (2006.01)
*H01L 21/336* (2006.01)

(52) U.S. Cl.
USPC ................... 257/329; 257/343; 257/E29.258; 438/268

(58) Field of Classification Search
USPC ................. 257/329, 343, E29.258; 438/268
See application file for complete search history.

(56) References Cited

U.S. PATENT DOCUMENTS

| 1,818,435 A | 2/1929 | Smith et al. |
| 3,662,450 A | 5/1972 | Kish et al. |

(Continued)

FOREIGN PATENT DOCUMENTS

| CN | 1746954 A | 3/2006 |
| DE | 4240427 C1 | 1/1994 |

(Continued)

OTHER PUBLICATIONS

International Search Report dated Feb. 10, 2011 from PCT/CN2010/078121.

(Continued)

*Primary Examiner* — Mark Prenty
(74) *Attorney, Agent, or Firm* — Ohlandt, Greeley, Ruggiero & Perle, L.L.P.

(57) ABSTRACT

A method for manufacturing compatible vertical double diffused metal oxide semiconductor (VDMOS) transistor and lateral double diffused metal oxide semiconductor (LDMOS) transistor includes: providing a substrate having an LDMOS transistor region and a VDMOS transistor region; forming an N-buried region in the substrate; forming an epitaxial layer on the N-buried layer region; forming isolation regions in the LDMOS transistor region and the VDMOS transistor region; forming a drift region in the LDMOS transistor region; forming gates in the LDMOS transistor region and the VDMOS transistor region; forming PBODY regions in the LDMOS transistor region and the VDMOS transistor region; forming an N-type GRADE region in the LDMOS transistor region; forming an NSINK region in the VDMOS transistor region, where the NSINK region is in contact with the N-buried layer region; forming sources and drains in the LDMOS transistor region and the VDMOS transistor region; and forming a P+ region in the LDMOS transistor region, where the P+ region is in contact with the source.

12 Claims, 4 Drawing Sheets

(56) References Cited

U.S. PATENT DOCUMENTS

| | | |
|---|---|---|
| 5,148,698 A | 9/1992 | Dischler |
| 5,666,711 A | 9/1997 | Pfeiffer |
| 5,913,114 A | 6/1999 | Lee et al. |
| 6,405,411 B1 | 6/2002 | Allemann et al. |
| 6,773,995 B2 | 8/2004 | Shin et al. |
| 6,927,452 B2 | 8/2005 | Shin et al. |
| 7,514,743 B2 | 4/2009 | Yang |
| 7,535,057 B2 | 5/2009 | Yang |
| 2012/0256252 A1* | 10/2012 | Gui et al. ............ 257/329 |

FOREIGN PATENT DOCUMENTS

| | | | |
|---|---|---|---|
| DE | 10-2009-032113 A1 | 1/2011 |
| EP | 1036608 A1 | 9/2000 |
| JP | 2003-282822 A | 10/2003 |
| JP | 2006-032493 A | 2/2006 |
| JP | 2006-509360 A | 3/2006 |
| JP | 2007-335881 A | 12/2007 |
| JP | 2009-239111 A | 10/2009 |
| KR | 2004-0051669 A | 6/2004 |

OTHER PUBLICATIONS

First Office Action dated Apr. 16, 2013 for corresponding Japanese patent application No. JP2012-524103 with English translation, pp. 2.

* cited by examiner

COMPATIBLE VERTICAL DOUBLE DIFFUSED METAL OXIDE SEMICONDUCTOR TRANSISTOR AND LATERAL DOUBLE DIFFUSED METAL OXIDE SEMICONDUCTOR TRANSISTOR AND MANUFACTURE METHOD THEREOF

This application claims the priority to Chinese Patent Application no. 200910209187.5, filed with the Chinese Patent Office on Oct. 28, 2009 and entitled "LDMOS TRANSISTOR COMPATIBLE WITH VDMOS TRANSISTOR AND METHOD FOR FABRICATING THE SAME", which is hereby incorporated by reference in its entirety.

FIELD OF THE INVENTION

The present invention relates to the field of fabricating a semiconductor device and in particular to an LDMOS transistor compatible with a VDMOS transistor and a method for fabricating the same.

BACKGROUND OF THE PRESENT INVENTION

Along with constant development of semiconductor processes, the three originally independent branches of BIPOLAR, Complementary Metal Oxide Semiconductor (CMOS) and Double-diffused Metal Oxide Semiconductor (DMOS) field effect transistors have been integrated constantly with each other so that the processes of BICMOS into which the BIPOLAR and the CMOS are integrated together and of BCD into which the three are integrated jointly have gradually come into being. With the BCD process into which the BIPOLAR, the CMOS and the DMOS are integrated, the three different types of common processes are integrated: the BIPOLAR is intended for analogy control; the CMOS is intended for digital control; and the DMOS is intended to enable soft startup and power output of a system in the case of the processing of high voltage and large current occurring in management in chip or system. Since respective advantages of the three kinds of devices are integrated in the BCD process, a BCD-based product can be can be integrated with a complex control function so that it has become a predominant process of power integrated circuits. For the BCD process, different devices can be selected for a varying circuit to optimize corresponding sub-circuits, thereby accommodating requirements on low power consumption, high integration, high speed, a high driving capability and large current of the entire circuit.

High voltage MOS transistors in the existing BCD process are primarily Laterally Double-diffused Metal Oxide Semiconductors (LDMOS). FIG. 1 illustrates the steps of forming an LDMOS transistor in the existing BCD process, where a substrate is prepared, the substrate can be made of silicon, silicon-germanium, etc.; boron ions are injected into the substrate to form an N-buried layer area 101; an N-epitaxial layer is formed on the N-buried layer area 101 by an epitaxial method; a first photoresist layer (not illustrated) is formed on the N-epitaxial layer, and an N-well pattern is defined by lithograph process; phosphorus ions are injected into the N-epitaxial layer along the N-well pattern using the first photoresist layer as a mask to form an N-well 102; a second photoresist layer (not illustrated) is formed on the N-epitaxial layer after the first photoresist layer is removed, and a P-well pattern is defined by lithograph process; and phosphorus ions are injected into the N-epitaxial layer along the P-well pattern using the second photoresist layer as a mask to form a P-well 103.

As illustrated in FIG. 2, a LOCal Oxidation of Silicon (LOCOS) isolation area 104 is formed at the interface between the N-well 102 and the P-well 103 by a field oxidation method after the second photoresist layer is removed; a third photoresist layer (not illustrated) is formed on the N-epitaxial layer, and a drift area pattern is defined in the area of the P-well 103 by lithograph process; phosphorus ions are injected into the N-epitaxial layer along the drift area pattern using the third photoresist layer as a mask, and an annealing process is performed to form a drift area 106a; and then the epitaxial layer of the drift area 106a is oxidized in a wet oxygen thermal oxidization method using the third photoresist layer again as a mask to form an LOCOS field plate 106b; and next the third photoresist layer is removed.

As illustrated in FIG. 3, a polysilicon layer and a fourth photoresist layer (not illustrated) are formed sequentially on the N-epitaxial layer, and a gate pattern is defined on the fourth photoresist layer after exposure and development processes; and the polysilicon layer is etched along the gate pattern using the fourth photoresist layer as a mask, a gate 108 is formed on parts of the N-epitaxial layer and the drift area in the area of the P-well 103, and the fourth photoresist layer is removed.

As illustrated in FIG. 4, a fifth photoresist layer (not illustrated) is formed on the N-epitaxial layer, the LOCal Oxidation of Silicon (LOCOS) isolation area 104 and the gate 108, and a PBODY (P-type substrate concentration transition) area pattern is defined on the fifth photoresist layer between the gate 108 in the area of the P-well 103 and the LOCal Oxidation of Silicon (LOCOS) isolation area 104 after the exposure and development processes; and phosphorus ions are injected into the N-epitaxial layer along the PBODY area pattern using the fifth photoresist layer as a mask to form a PBODY area 109, wherein the PBODY 109 functions to form an active channel from a difference between its transverse diffusion length and that of a source/drain to control the threshold voltage of an LDMOS. A sixth photoresist layer (not illustrated) is formed on the N-epitaxial layer, the LOCal Oxidation of Silicon (LOCOS) isolation area 104 and the gate 108 after the fifth photoresist layer is removed, and an opening pattern is defined on the sixth photoresist layer between the drift areas 106 after the exposure and development processes; phosphorus ions are injected into the N-epitaxial layer along the opening pattern using the sixth photoresist layer as a mask, and the annealing process is performed to diffuse uniformly the phosphorus ions into a larger depth so as to form an N-type GRADE (concentration gradient) area 110, wherein the GRADE area functions to form N-type ions with a low concentration outside of the source/drain, to reduce the dope dose of PN junction and to increase the breakdown voltage of the junction. The sixth photoresist layer is removed.

As illustrated in FIG. 5, a seventh photoresist layer (not illustrated) is formed on the N-epitaxial layer, the LOCal Oxidation of Silicon (LOCOS) isolation area 104 and the gate 108, and a source/drain pattern is formed after the exposure and development processes; and phosphorus ions are injected into the PBODY area 109 and the N-type GRADE area 110 in the N-epitaxial layer along the source/drain pattern using the seventh photoresist layer as a mask to form a source S in the PBODY area 109 and a drain D in the N-type GRADE area 110. Further referring to FIG. 5, an eighth photoresist layer (not illustrated) is formed on the N-epitaxial layer, the LOCal Oxidation of Silicon (LOCOS) isolation area 104 and the gate 108 after the seventh photoresist layer is removed, and a P+ area pattern is defined by lithograph process; and boron ions are injected into the PBODY area 109 in the N-epitaxial layer along the P+ area pattern using the eighth photoresist layer as a mask to form a P+ area 112, wherein the P+ area 112 is connected with the source S and functions to prevent a substrate electrode and the source from being shorted and to alleviate a substrate bias effect. Next the eighth photoresist layer is removed.

However since the high voltage MOS transistors in the existing BCD process are primarily LDMOS, there is no possibility to arrange compatibly LDMOS and Vertical Double-diffused Metal Oxide Semiconductor (VDMOS) on the same process platform to accommodate the high voltage-resistance of the LDMOS and the large current driving capability of the VDMOS.

SUMMARY OF THE PRESENT INVENTION

The invention address the issue of providing a method for fabricating an LDMOS transistor compatible with a VDMOS transistor to address the impossibility of the BCD process to offer an LDMOS transistor compatible with a VDMOS transistor.

To address the foregoing issue, the invention provides a method for fabricating an LDMOS transistor compatible with a VDMOS transistor including: preparing a substrate with an LDMOS transistor area and a VDMOS transistor area; forming an N-buried layer area by injecting ions into the substrate; forming an epitaxial layer in the N-buried layer area and then injecting ions into the epitaxial layer to form an N-well and a P-well in the LDMOS transistor area and a high voltage N-well in the VDMOS transistor area; forming an isolation area at the interface between the N-well and the P-well in the LDMOS transistor area and at the interface between the LDMOS transistor area and the VDMOS transistor area; forming a drift area in the area of the P-well in the LDMOS transistor area; forming a gate on a part of the epitaxial layer and a part of the drift area in the area of the P-well of the LDMOS transistor area, and in the VDMOS transistor area; forming a PBODY area in the epitaxial layer between the gate and the isolation area in the LDMOS transistor area, and in the epitaxial layer between the gates in the VDMOS transistor area; forming an N-type GRADE area in the epitaxial layer between the drift areas in the LDMOS transistor area; forming an NSINK area in the epitaxial layer between the isolation area and the adjacent gate in the VDMOS transistor area, the NSINK area being communicated with the N-buried layer area; forming a source in the PBODY area and a drain in the N-type GRADE area in the LDMOS transistor area, and forming a source in the PBODY area and a drain in the NSINK area in the VDMOS transistor area; and forming a P+ area in the PBODY area in the LDMOS transistor area, the P+ area being communicated with the source.

Optionally, the ions injected to form the NSINK area are phosphorus ions, which are injected at a dosage of $1\times10^{15}/cm^2$ and energy of 300 KeV~400 KeV.

Optionally, the ions injected to form the N-buried layer area are antimony ions, which are injected at a dosage of $1\times10^{15}/cm^2$ and energy of 40 KeV.

Optionally, forming the drift area further includes: injecting phosphorus ions into a part of the area of the P well to form the drift area; and performing an oxidization process in the drift area to form an LOCOS field plate.

Optionally, the phosphorus ions are injected at a dosage of $1\times10^{12}/cm^2$ and energy of 40 KeV~50 KeV. The drift area is oxidized by a wet oxygen thermal oxidization method.

Optionally, the ions injected to form the PBODY area are boron ions, which are injected at a dosage of $2\times10^{13}/cm^2$ and energy of 40 KeV.

Optionally, the ions injected to form the N-type GRADE area are phosphorus ions, which are injected at a dosage of $1\times10^{13}/cm^2$ and energy of 80 KeV~100 KeV.

Optionally, the ions injected to form the source/drain are arsenic ions, which are injected at a dosage of $4\times10^{15}/cm^2$ and energy of 80 KeV.

Optionally, the ions injected to form the P+ area are formed boron difluoride, which are injected at a dosage of $2\times10^{15}/cm^2$ and energy of 60 KeV~80 KeV.

The invention further provides an LDMOS transistor compatible with a VDMOS transistor, including: a substrate with an LDMOS transistor area and a VDMOS transistor area; an N-buried layer area located in the substrate; an epitaxial layer located in the N-buried layer area; an N-well and a P-well adjoining the N-well, which are formed in the epitaxial layer of the LDMOS transistor area; a high voltage N-well formed in the VDMOS transistor area; an isolation area located at the interface between the N-well and the P-well in the LDMOS transistor area and at the interface between the LDMOS transistor area and the VDMOS transistor area; a drift area located in the area of the P-well in the LDMOS transistor area; a gate located on a part of the epitaxial layer and a part of the drift area in the area of the P-well of the LDMOS transistor area, and on the epitaxial layer of the VDMOS transistor area; a PBODY area located in the epitaxial layer between the gate and the isolation area in the LDMOS transistor area, and in the epitaxial layer between the gates in the VDMOS transistor area; an N-type GRADE area located in the epitaxial layer between the drift areas in the LDMOS transistor area; a source located in the PBODY area of the LDMOS transistor area and the PBODY area of the VDMOS transistor area; a P+ area located in the PBODY area of the LDMOS transistor area and communicated with the source; an NSINK area located in the epitaxial layer between the isolation area and the adjacent gate in the VDMOS transistor area and communicated with the N-buried layer area; and drains located in the N-type GRADE area of the LDMOS transistor area and in the NSINK area.

As compared with the prior art, the invention has such an advantage that the NSINK area is formed in the epitaxial layer between the isolation area and the adjacent gate in the VDMOS transistor area, and the NSINK area is communicated with the N-buried layer area, which enables communication between the drains, thereby achieving compatibility of an LDMOS transistor with a VDMOS transistor on a BCD process platform and further accommodating a performance demand for high voltage and large current.

DETAILED DESCRIPTION OF THE INVENTION

Figure 1:
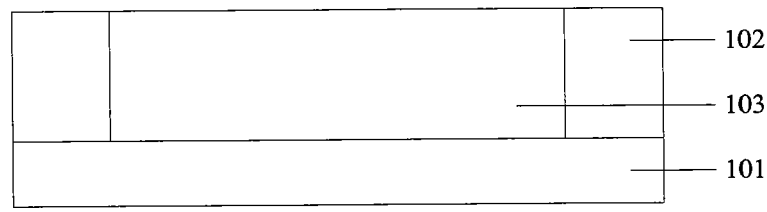
FIG. 1 to FIG. 5 illustrate schematic diagrams of forming an LDMOS transistor in the existing BCD process.
Figure 2:
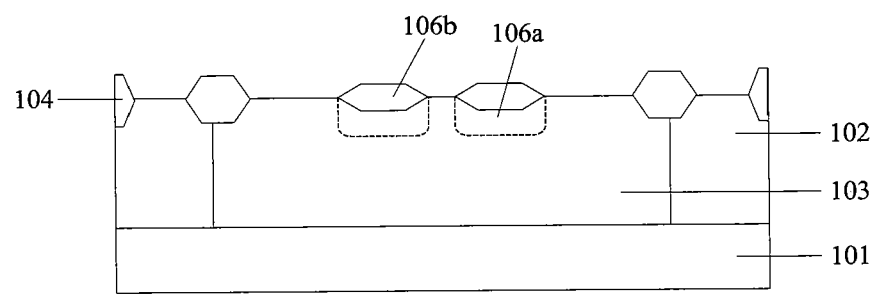
Figure 3:
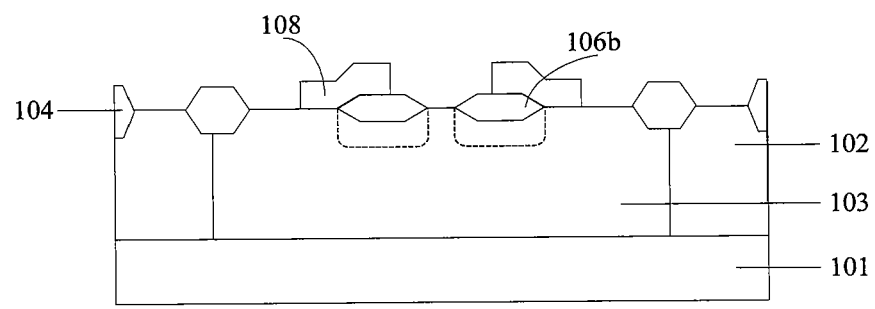
Figure 4:
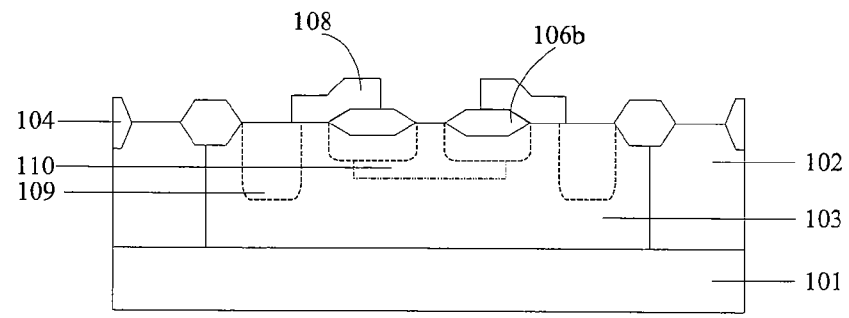
Figure 5:
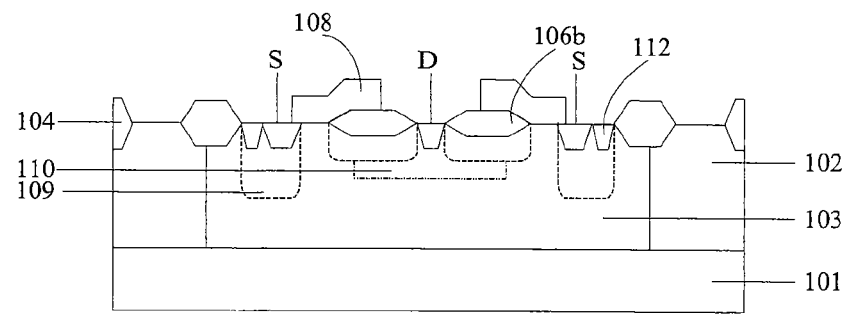

In an embodiment of the invention in which an LDMOS transistor compatible with a VDMOS transistor is fabricated, a substrate is prepared with an LDMOS transistor area and a VDMOS transistor area; ions are injected into the substrate to form an N-buried layer area; an epitaxial layer is formed in the N-buried layer area, and then ions are injected into the epitaxial layer to form an N-well and a P-well in the LDMOS transistor area and a high voltage N-well in the VDMOS transistor area; an isolation area is formed at the interface between the N-well and the P-well in the LDMOS transistor area and at the interface between the LDMOS transistor area and the VDMOS transistor area; a drift area is formed in the area of the P-well of the LDMOS transistor area; a gate is formed on a part of the epitaxial layer and a part of the drift area in the area of the P-well of the LDMOS transistor area, and in the VDMOS transistor area; a PBODY area is formed in the epitaxial layer between the gate and the isolation area in the LDMOS transistor area, and in the epitaxial layer between the gates of the VDMOS transistor area; an N-type GRADE area is formed in the epitaxial layer between the drift areas in the LDMOS transistor area; an NSINK area is formed in the epitaxial layer between the isolation area and the adjacent gate in the VDMOS transistor area, wherein the NSINK area is communicated with the N-buried layer area; a source is formed in the PBODY area and a drain is formed in the N-type GRADE area in the LDMOS transistor area, and a source is formed in the PBODY area and a drain is formed in the NSINK area in the VDMOS transistor area; and a P+ area is formed in the PBODY area of the LDMOS transistor area, wherein the P+ area is communicated with the source.

An LDMOS transistor compatible with a VDMOS transistor formed according to the foregoing embodiment includes: a substrate with an LDMOS transistor area and a VDMOS transistor area; an N-buried layer area located in the substrate; an epitaxial layer located in the N-buried layer area; an N-well and a P-well adjoining the N-well, which are formed in the epitaxial layer of the LDMOS transistor area; a high voltage N-well formed in the VDMOS transistor area; an isolation area located at the interface between the N-well and the P-well in the LDMOS transistor area and at the interface between the LDMOS transistor area and the VDMOS transistor area; a drift area located in the area of P-well in the LDMOS transistor area; a gate on a part of the epitaxial layer and a part of the drift area in the area of the P-well of the LDMOS transistor area, and on the epitaxial layer in the VDMOS transistor area; a PBODY area located in the epitaxial layer between the gate and the isolation area in the LDMOS transistor area, and in the epitaxial layer between the gates in the VDMOS transistor area; an N-type GRADE area located in the epitaxial layer between the drift areas in the LDMOS transistor area; a source located in the PBODY area of the LDMOS transistor area and the PBODY area of the VDMOS transistor area; a P+ area located in the PBODY area of the LDMOS transistor area and communicated with the source; an NSINK area located in the epitaxial layer between the isolation area and the adjacent gate in the VDMOS transistor area and communicated with the N-buried layer area; and drains located in the N-type GRADE area of the LDMOS transistor area and in the NSINK area.

The invention forms the NSINK area in the epitaxial layer between the isolation area and the adjacent gate in the VDMOS transistor area and the NSINK area is communicated with the N-buried layer area, which enables communication between the drains, thereby achieving compatibility of an LDMOS transistor with a VDMOS transistor on a BCD process platform and further accommodating a performance demand for high voltage and large current.

An embodiment of the invention will be detailed hereinafter with reference to the drawings.

Figure 6:
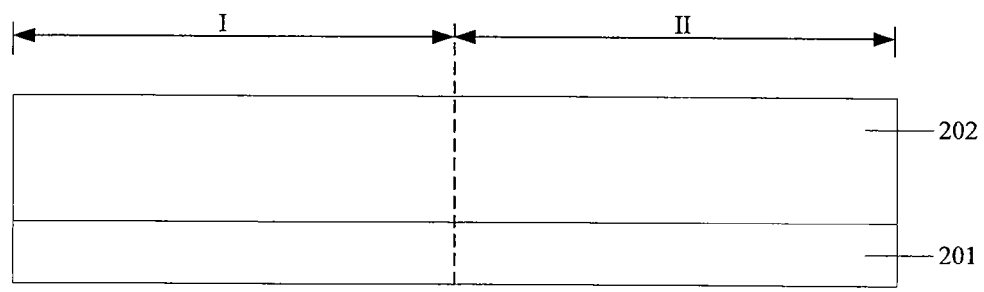
FIG. 6 to FIG. 11 illustrate schematic diagrams of a method for fabricating an LDMOS transistor compatible with a VDMOS transistor according to the invention.

FIG. 6 to FIG. 11 illustrate schematic diagrams of a method for fabricating an LDMOS transistor compatible with a VDMOS transistor according to the invention. As illustrated in FIG. 6, a substrate is prepared, wherein the substrate can be made of silicon, silicon-germanium, etc., and has an LDMOS transistor area I and a VDMOS transistor area II. N-type ions are injected into the substrate to form an N-buried layer area 201. The N-type ions can be antimony ions and are injected at a dosage of $1\times10^{15}/cm^2$ and energy of approximately 40 KeV. Next an N-epitaxial layer 202 with a thickness of approximately 4 μm is formed on the N-buried layer area 201 by epitaxial growth method.

Figure 7:
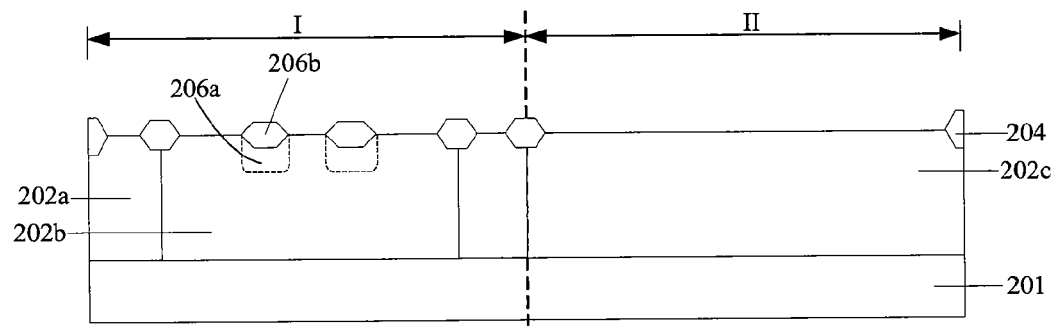

As illustrated in FIG. 7, firstly a first photoresist layer (not illustrated) is formed on the N-epitaxial layer, and an N-well pattern is defined in the LDMOS transistor area I by lithograph process; and N-type ions are injected into the N-epitaxial layer along the N-well pattern using the first photoresist layer as a mask to form an N-well 202a, the N-type ions can be phosphorus ions and are injected at a dosage of $6\times10^{12}/cm^2 \sim 8\times10^{12}/cm^2$ and energy of approximately 150 KeV. A second photoresist layer (not illustrated) is formed on the N-epitaxial layer after the first photoresist layer is removed by ashing method or wet etching method, and a P-well pattern is defined in the LDMOS transistor area I by lithograph process; and P-type ions are injected into the N-epitaxial layer along the P-well pattern using the second photoresist layer as a mask to form an P-well 202b, and the P-type ions can be boron ions and are injected at a dosage of $8\times10^{12}/cm^2 \sim 1\times10^{13}/cm^2$ and energy of 50 Kev~60 KeV. A third photoresist layer (not illustrated) is formed on the N-epitaxial layer after the second photoresist layer is removed by ashing method or wet etching method, and a high voltage N-well pattern is defined in the VDMOS transistor area II by lithograph process; and N-type ions are injected into the N-epitaxial layer along the high voltage N-well pattern using the third photoresist layer as a mask to form a high voltage N-well 202c and the N-type ions can be phosphorus ions and are injected at a dosage of $1\times10^{12}/cm^2 \sim 2\times10^{12}/cm^2$ and energy of 150 Kev.

Further referring to FIG. 7, a LOCal Oxidation of Silicon (LOCOS) isolation area 204 is formed in the N-epitaxial layer at the interface between the N-well 202a and the P-well 202b in the LDMOS transistor area I and in the N-epitaxial layer at the interface between the LDMOS transistor area I and the VDMOS transistor area II by field oxidation method, after the third photoresist layer is removed by ashing method or wet etching method. Specifically, a pad oxide layer is formed on the N-epitaxial layer by thermal oxidation method; an etch barrier layer of a material of silicon oxide is formed on the pad oxide layer by chemical vapor deposition method; a fourth photoresist layer (not illustrated) is formed on the etch barrier layer by spin coating method, and an isolation area pattern is defined after exposure and development processes; the etch barrier layer and the pad oxide layer are etched by dry etching method using the fourth photoresist layer as a mask to form an opening; and after the fourth photoresist layer is removed, the N-epitaxial layer at the opening is oxidized by thermal oxidization method for combining oxygen with silicon to form the LOCal Oxidation of Silicon (LOCOS) isolation area 204 of a material of silicon dioxide.

Further referring to FIG. 7, a fifth photoresist layer (not illustrated) is formed on the N-epitaxial layer, and a drift area pattern is defined in the area of P-well 202b of the LDMOS transistor area I by lithograph process; the etch barrier layer is etched using the fifth photoresist layer as a mask to form a drift area opening pattern, phosphorus ions are injected into the N-epitaxial layer along the drift area pattern, and after the fifth photoresist layer is removed an annealing process is performed to form a drift area 206a; subsequently the N-epitaxial layer of the drift area 206a is oxidized by wet oxygen thermal oxidization method using the etch barrier layer as a mask to form an LOCOS field plate 206b. Next the etch barrier layer is removed with hot phosphoric acid and the pad oxide layer is removed with hydrofluoric acid.

Figure 8:
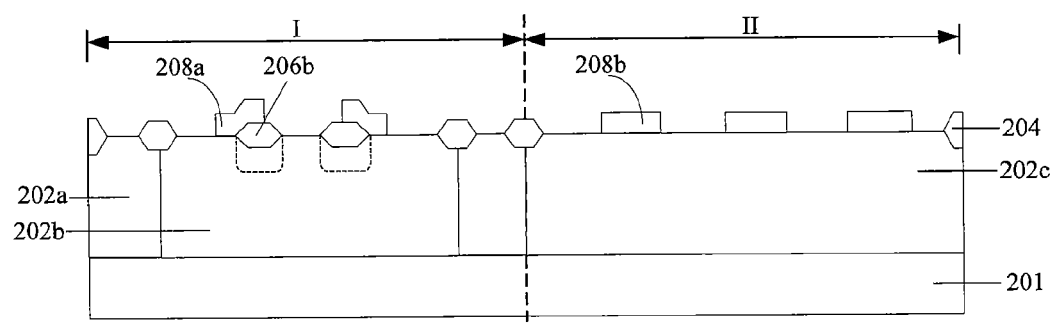

As illustrated in FIG. 8, a poly-silicon layer with a thickness of approximately 3000 angstroms is formed on the N-epitaxial layer by chemical vapor deposition method; a sixth photoresist layer (not illustrated) is formed on the poly-silicon layer by spin coating method, and a gate pattern is defined on the sixth photoresist layer after the exposure and development processes; the poly-silicon layer is etched along the gate pattern using the sixth photoresist layer as a mask, and a gate 208a is formed on parts of N-epitaxial and the drift area in the area of the P-well 103 of the LDMOS transistor area I while a gate 208b is formed on the N-epitaxial layer of the VDMOS transistor area II. Next the sixth photoresist layer is removed by ashing method or wet etching method.

Figure 9:
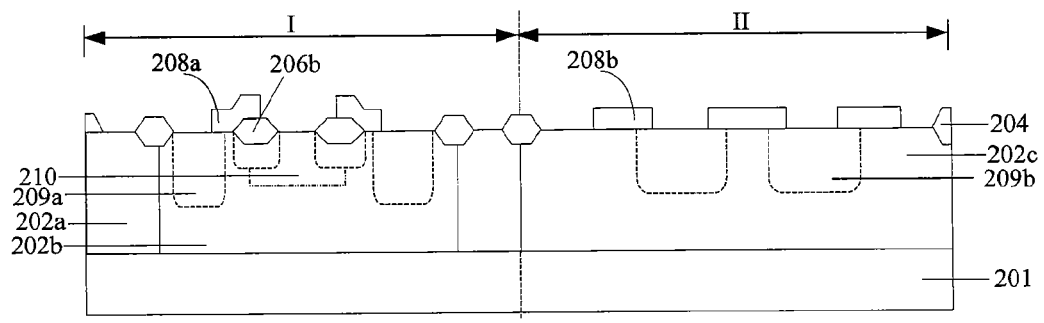

Referring to FIG. 9, a seventh photoresist layer (not illustrated) is formed on the N-epitaxial, the LOCal Oxidation of Silicon (LOCOS) isolation area 204 and the gates 208a and 208b, and a PBODY area pattern is defined after the exposure and development processes; N-type ions are injected into the N-epitaxial layer along the PBODY area pattern using the seventh photoresist layer as a mask to form a PBODY area 209a between the gate 208a and the LOCal Oxidation of Silicon (LOCOS) isolation area 204 in the LDMOS transistor area I and a PBODY area 209b between the gates 208b in the VDMOS transistor area II, and the PBODY areas 209a and 209b function to form an active channel from a difference between their transverse diffusion lengths and the transverse diffusion length of a source/drain to control the threshold voltage of an LDMOS, where the P-type ions are boron ions and injected at a dosage of approximately $2\times10^{13}/cm^2$ and energy of 40 KeV. Next the seventh photoresist layer is removed by ashing method or wet etching method.

Further referring to FIG. 9, an eighth photoresist layer (not illustrated) is formed on the N-epitaxial layer, the LOCal Oxidation of Silicon (LOCOS) isolation area 204 and the gates 208a and 208b, and an opening pattern is defined on the eighth photoresist layer between the drift areas 106 after the lithograph process; N-type ions are injected into the N-epitaxial layer along the opening pattern using the eighth photoresist layer as a mask, and the annealing process is performed to diffuse uniformly the N-type ions into a larger depth to form an N-type GRADE area 210, wherein the N-type GRADE area 210 functions to form the N-type ions with a low concentration outside of the source/drain so as to reduce the dope dose of a PN junction and to increase the breakdown voltage of the junction. The eighth photoresist layer is removed.

In the present embodiment, the N-type ions injected to form the N-type GRADE area 210 are phosphorus ions. The ions are injected at a dosage of $1\times10^{13}/cm^2$ and energy of 80 KeV~100 KeV.

Figure 10:
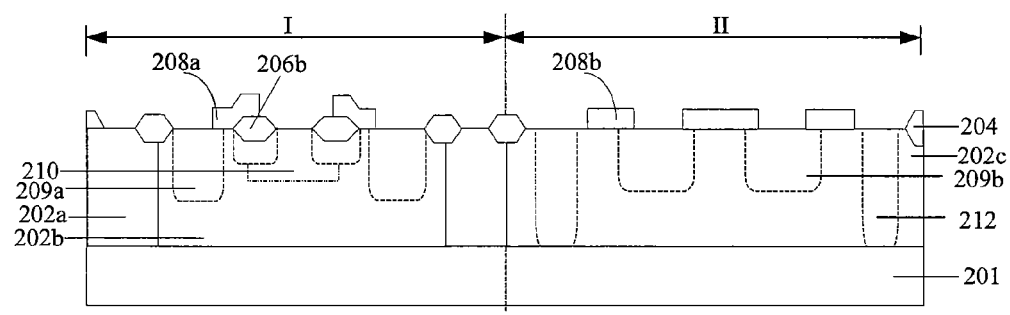

As illustrated in FIG. 10, a ninth photoresist layer (not illustrated) is spin-coated on the N-epitaxial layer, the LOCal Oxidation of Silicon (LOCOS) isolation area 204 and the gates 208a and 208b, and an NSINK area pattern is defined in the VDMOS transistor area II after the exposure and development processes; N-type ions are injected into the epitaxial layer between the LOCal Oxidation of Silicon (LOCOS) isolation area 204 and the adjacent gate 208b in the VDMOS transistor area II along the NSINK area pattern using the ninth photoresist layer as a mask to form an NSINK area 212, wherein the NSINK area 212 is communicated with the N-buried layer area 201. Moreover, the NSINK area 212 functions to lead a drain electrode out of the substrate, thereby improve the dope dose as much as possible and reducing the series resistance. The ninth photoresist layer is removed.

In the present embodiment, the N-type ions injected to form the NSINK area 212 are phosphorus ions. The ions are injected at a dosage of $1\times10^{15}/cm^2$ and energy of 300 KeV~400 KeV.

Figure 11:
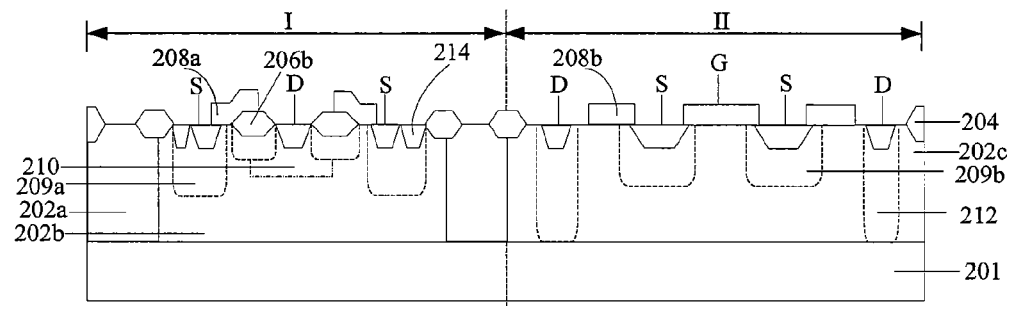

As illustrated in FIG. 11, a tenth photoresist layer (not illustrated) is spin-coated on the N-epitaxial layer, the LOCal Oxidation of Silicon (LOCOS) isolation area 204 and the gates 208a and 208b, and source and drain patterns are defined by lithograph process; N-type ions are injected into the PBODY area 209a and the N-type GRADE area 210 in the N-epitaxial layer of the LDMOS transistor area I along the source and drain patterns using the tenth photoresist layer as a mask to form a source S in the PBODY area 209a and a drain D in the N-type GRADE area 210; and N-type ions are injected into the PBODY area 209b and the NSINK area 212 in the N-epitaxial layer of the VDMOS transistor area II to form a source S in the PBODY area 209b and a drain D in the NSKIN area 212.

In the present embodiment, the N-type ions injected to form the sources S and the drains D are arsenic ions. The ions are injected at a dosage of $4\times10^{15}/cm^2$ and energy of 80 KeV.

Further referring to FIG. 11, an eleventh photoresist layer (not illustrated) is formed on the N-epitaxial layer, the LOCal Oxidation of Silicon (LOCOS) isolation area 204 and the gates 208a and 208b after the tenth photoresist layer is removed, and a P+ area pattern is defined in the LDMOS transistor area I after the lithograph process; and P-type ions are injected into the PBODY area 209a in the N-epitaxial layer of the LDMOS transistor area I along the P+ area pattern using the eleventh photoresist layer as a mask to form a P+ area 214, wherein the P+ area 214 is connected with the source S in the LDMOS transistor area I and functions to prevent a substrate electrode and the source in the LDMOS from being shorted and to alleviate a substrate bias effect. Next the eleventh photoresist layer is removed.

In the present embodiment, the P-type ions injected to form the P+ area 214 are boron difluoride ions. The ions are injected at a dosage of $2\times10^{15}/cm^2$ and energy of 60 KeV~80 KeV.

An LDMOS transistor compatible with a VDMOS transistor formed according to the foregoing embodiment includes: a substrate with an LDMOS transistor area I and a VDMOS transistor II; an N-buried layer area 201 formed by injecting P-type ions into the substrate; an epitaxial layer located in the N-buried layer area; an N-well 202a and a P-well 202b adjoining the N-well 202a, which are located in the N epitaxial layer of the LDMOS transistor area I; a high voltage N-well located in the N-epitaxial layer of the VDMOS transistor area II; an LOCal Oxidation of Silicon (LOCOS) isolation area 204 located at the interface between the N-well 202a and the P-well 202b in the LDMOS transistor area I and at the interface between the LDMOS transistor area I and the VDMOS transistor area II; a drift area 206 located in the area of the P-well 202b of the LDMOS transistor area I; a gate 208a located on a part of the epitaxial layer and a part of the drift area 206 in the area of the P-well of the LDMOS transistor area I; a gate 208b located on the epitaxial layer in the VDMOS transistor area II; a PBODY area 209a located in the epitaxial layer between the gate 208a and the LOCal Oxidation of Silicon (LOCOS) isolation area 204 in the LDMOS transistor area I; a PBODY area 209b in the epitaxial layer between the gates 208b in the VDMOS transistor area II; an N-type GRADE area 210 located in the epitaxial layer between the drift areas 206 in the LDMOS transistor area I; an NSINK area 212 located in the epitaxial layer between the LOCal Oxidation of Silicon (LOCOS) isolation area 204 and the adjacent gate in the VDMOS transistor area II and communicated with the N-buried layer area 201; sources S located respectively in the PBODY areas 209a and 209b of the LDMOS transistor area I and the VDMOS transistor area II; drains D located respectively in the N-type GRADE area 210 of the LDMOS transistor area I and in the NSINK area 212; and a P+ area 214 located in the PBODY area 209a of the LDMOS transistor area I and communicated with the source S in the PBODY area 209a.

Although the invention has been disclosed as above in the preferred embodiments thereof, the invention will not be limited thereto. Any those skilled in the art can make various modifications and variations without departing the spirit and scope of the invention. Accordingly, the scope of the invention shall be as defined in the appended claims.

What is claimed is:

1. A method for fabricating an LDMOS transistor compatible with a VDMOS transistor comprising:
   preparing a substrate with an LDMOS transistor area and a VDMOS transistor area;
   forming an N-buried layer area by injecting ions into the substrate;
   forming an epitaxial layer in the N-buried layer area, and then injecting ions into the epitaxial layer to form an N-well and a P-well in the LDMOS transistor area and a high voltage N-well in the VDMOS transistor area;
   forming an isolation area at the interface between the N-well and the P-well in the LDMOS transistor area and at the interface between the LDMOS transistor area and the VDMOS transistor area;
   forming a drift area in the area of the P-well of the LDMOS transistor area;
   forming a gate on a part of the epitaxial layer and a part of the drift area in the area of the P-well of the LDMOS transistor area, and in the VDMOS transistor area;
   forming a PBODY area in the epitaxial layer between the gate and the isolation area in the LDMOS transistor area, and in the epitaxial layer between the gates in the VDMOS transistor area;
   forming an N-type GRADE area in the epitaxial layer between the drift areas in the LDMOS transistor area;
   forming an NSINK area in the epitaxial layer between the isolation area and the adjacent gate in the VDMOS transistor area, the NSINK area being communicated with the N-buried layer area;
   forming a source in the PBODY area and a drain in the N-type GRADE area in the LDMOS transistor area, and forming a source in the PBODY area and a drain in the NSINK area in the VDMOS transistor area; and
   forming a P+ area in the PBODY area in the LDMOS transistor area, the P+ area being communicated with the source.

2. The method for fabricating an LDMOS transistor compatible with a VDMOS transistor according to claim 1, wherein the ions injected to form the NSINK area are phosphorus ions.

3. The method for fabricating an LDMOS transistor compatible with a VDMOS transistor according to claim 2, wherein the ions are injected at a dosage of $1 \times 10^{15}/cm^2$ and energy of 300 KeV~400 KeV.

4. The method for fabricating an LDMOS transistor compatible with a VDMOS transistor according to claim 1, wherein the ions injected to form the N-buried layer area are antimony ions, which are injected at a dosage of $1 \times 10^{15}/cm^2$ and energy of 40 KeV.

5. The method for fabricating an LDMOS transistor compatible with a VDMOS transistor according to claim 1, wherein the drift area is formed by:
   injecting phosphorus ions into a part of the area of the P well to form the drift area; and
   performing an oxidization process in the drift area to form an LOCOS field plate.

6. The method for fabricating an LDMOS transistor compatible with a VDMOS transistor according to claim 5, wherein the phosphorus ions are injected at a dosage of $1 \times 10^{12}/cm^2$ and energy of 40 KeV~50 KeV.

7. The method for fabricating an LDMOS transistor compatible with a VDMOS transistor according to claim 5, wherein the drift area is oxidized by wet oxygen thermal oxidization method.

8. The method for fabricating an LDMOS transistor compatible with a VDMOS transistor according to claim 1, wherein the ions injected to form the PBODY area are boron ions, which is injected at a dosage of $2 \times 10^{13}/cm^2$ and energy of 40 KeV.

9. The method for fabricating an LDMOS transistor compatible with a VDMOS transistor according to claim 1, wherein the ions injected to form the N-type GRADE area are phosphorus ions, which is injected at a dosage of $1 \times 10^{13}/cm^2$ and energy of 80 KeV~100 KeV.

10. The method for fabricating an LDMOS transistor compatible with a VDMOS transistor according to claim 1, wherein the ions injected to form the source/drain are arsenic ions, which is injected at a dosage of $4 \times 10^{15}/cm^2$ and energy of 80 KeV.

11. The method for fabricating an LDMOS transistor compatible with a VDMOS transistor according to claim 1, wherein the ions injected to form the P+ area are boron difluoride, which is injected at a dosage of $2 \times 10^{15}/cm^2$ and energy of 60 KeV~80 KeV.

12. An LDMOS transistor compatible with a VDMOS transistor, comprising: a substrate with an LDMOS transistor area and a VDMOS transistor area; an N-buried layer area located in the substrate; an epitaxial layer located in the N-buried layer area; an N-well and a P-well adjoining the N-well, which are formed in the epitaxial layer of the LDMOS transistor area; a high voltage N-well located in the VDMOS transistor area; an isolation area located at the interface between the N-well and the P-well in the LDMOS transistor area and at the interface between the LDMOS transistor area and the VDMOS transistor area; a drift area located in the area of the P-well of the LDMOS transistor area; a gate located on a part of the epitaxial layer and a part of the drift area in the area of the P-well of the LDMOS transistor area, and on the epitaxial layer of the VDMOS transistor area; a PBODY area located in the epitaxial layer between the gate and the isolation area in the LDMOS transistor area, and in the epitaxial layer between the gates in the VDMOS transistor area; an N-type GRADE area located in the epitaxial layer between the drift areas in the LDMOS transistor area; a source located in the PBODY area of the LDMOS transistor area and the PBODY area of the VDMOS transistor area; and a P+ area located in the PBODY area of the LDMOS transistor area and communicated with the source, wherein the LDMOS transistor further comprises: an NSINK area located in the epitaxial layer between the isolation area and the adjacent gate in the VDMOS transistor area and communicated with the N-buried layer area; and drains located in the N-type GRADE area of the LDMOS transistor area and in the NSINK area.

* * * * *

UNITED STATES PATENT AND TRADEMARK OFFICE
CERTIFICATE OF CORRECTION

| | | |
|---|---|---|
| PATENT NO. | : 8,530,961 B2 | |
| APPLICATION NO. | : 13/384002 | |
| DATED | : September 10, 2013 | |
| INVENTOR(S) | : Linchun Gui et al. | |

It is certified that error appears in the above-identified patent and that said Letters Patent is hereby corrected as shown below:

ON THE TITLE PAGE, ITEM (73) ASSIGNEE: ADD THE SECOND RECORDED ASSIGNEE
    -- CSMC TECHNOLOGIES FAB2 CO., LTD.    CHINA (CN) --.

Signed and Sealed this
Fourteenth Day of January, 2014

Michelle K. Lee
*Deputy Director of the United States Patent and Trademark Office*